(12) United States Patent
Tokumasu et al.

(10) Patent No.: US 10,998,887 B2
(45) Date of Patent: *May 4, 2021

(54) POWER DEVICE DRIVING APPARATUS

(71) Applicant: DENSO CORPORATION, Kariya (JP)

(72) Inventors: Akira Tokumasu, Kariya (JP);
Tomotaka Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/838,390

(22) Filed: Apr. 2, 2020

(65) Prior Publication Data

US 2020/0235723 A1 Jul. 23, 2020

Related U.S. Application Data

(62) Division of application No. 16/519,765, filed on Jul. 23, 2019, now Pat. No. 10,892,741.

(30) Foreign Application Priority Data

Jul. 23, 2018 (JP) .............................. JP2018-137853

(51) Int. Cl.
*H02M 3/335* (2006.01)
*H03K 17/567* (2006.01)
(Continued)

(52) U.S. Cl.
CPC ............. *H03K 3/012* (2013.01); *H03K 3/017* (2013.01); *H03K 17/567* (2013.01); *H03K 17/687* (2013.01)

(58) Field of Classification Search
None
See application file for complete search history.

(56) References Cited

U.S. PATENT DOCUMENTS 5,686,859 A 11/1997 Majumdar et al.
5,973,941 A * 10/1999 Zaim ...................... G01R 31/40
363/21.08

(Continued)

FOREIGN PATENT DOCUMENTS

JP 2016-134882 A 7/2016

OTHER PUBLICATIONS

Jul. 6, 2020 Office Action issued in U.S. Appl. No. 16/519,765.
Apr. 8, 2020 Office Action issued in U.S. Appl. No. 16/519,765.

*Primary Examiner* — Kenneth B Wells
(74) *Attorney, Agent, or Firm* — Oliff PLC

(57) ABSTRACT

A power device driving apparatus drives a plurality of power devices including first and second power devices. In the apparatus, a plurality of drive circuits are separately provided for at least the first power device and the second power device and output drive signals to the respective power devices. The isolated power supply includes a first isolated power supply unit that supplies a first supply voltage, and a second isolated power supply unit that supplies a second supply voltage that is different from the first supply voltage. The plurality of drive circuits includes a first drive circuit that uses the first supply voltage supplied from the first isolated power supply unit to output the drive signal to the first power device, and a second drive circuit that uses the second supply voltage supplied from the second isolated power supply unit to output the drive signal to the second power device.

3 Claims, 2 Drawing Sheets

(51) Int. Cl.
    *H03K 17/61*     (2006.01)
    *H03K 17/691*     (2006.01)
    *H03K 3/012*     (2006.01)
    *H03K 17/687*     (2006.01)
    *H03K 3/017*     (2006.01)

(56) References Cited

U.S. PATENT DOCUMENTS

| | | | |
|---|---|---|---|
| 6,369,525 B1 * | 4/2002 | Chang | H02M 3/33561 315/300 |
| 7,304,867 B2 * | 12/2007 | Usui | H02M 3/33561 363/21.06 |
| 7,400,061 B2 * | 7/2008 | Steigerwald | H02M 3/33561 307/17 |
| 7,821,239 B2 | 10/2010 | Hosotani et al. | |
| 7,906,868 B2 * | 3/2011 | Ferguson | H02M 3/3353 307/31 |
| 8,284,575 B2 * | 10/2012 | Inamura | H03K 17/0828 363/55 |
| 8,295,062 B2 | 10/2012 | Kawabe et al. | |
| 9,621,048 B2 * | 4/2017 | Hosotani | H02M 1/08 |
| 9,712,038 B2 * | 7/2017 | Miyauchi | H02M 1/084 |
| 9,724,999 B2 | 8/2017 | Miyauchi et al. | |
| 9,729,042 B2 * | 8/2017 | Miyauchi | H02M 1/08 |
| 9,960,710 B2 * | 5/2018 | Tsuji | H02M 7/42 |
| 10,277,136 B2 * | 4/2019 | Werner | H02M 1/08 |
| 2012/0134181 A1 | 5/2012 | Amano et al. | |
| 2017/0033790 A1 | 2/2017 | Osanai | |

* cited by examiner

POWER DEVICE DRIVING APPARATUS

CROSS-REFERENCE TO RELATED APPLICATION

This application is a divisional of U.S. application Ser. No. 16/519,765 filed Jul. 23, 2019, which is based on and claims priority under 35 U.S.C. 119 from Japanese Patent Application No. 2018-137853, filed Jul. 23, 2018. The entire contents of the above applications are incorporated herein by reference.

BACKGROUND

Technical Field

The present disclosure relates to a power device driving apparatus that drives a plurality of power devices connected in parallel to one another.

Related Art

A drive circuit that drives a plurality of switching elements being power devices connected in parallel is known in the related art. The drive circuit applies drive signals of the same voltage to the gate terminals of the respective switching elements. Thus, the switching elements are turned on by the drive signals of the same voltage applied by the drive circuit.

SUMMARY

The present disclosure provides a power device driving apparatus that drives a plurality of power devices connected in parallel to one another. The power devices include a first power device and a second power device. The power device driving apparatus includes a plurality of drive circuits and an isolated power supply. The plurality of drive circuits are separately provided for at least the first and second devices, and output drive signals to the respective power devices. The isolated power supply includes a first isolated power supply unit and a second isolated power supply unit. The first isolated power supply unit supplies a first supply voltage. The second isolated power supply unit supplies a second supply voltage that is different from the first supply voltage. The plurality of drive circuits includes a first drive circuit and a second drive circuit. The first drive circuit uses the first supply voltage supplied from the first isolated power supply unit to output the drive signal to the first power device. The second drive circuit uses the second supply voltage supplied from the second isolated power supply unit to output the drive signal to the second power device.

DESCRIPTION OF THE EMBODIMENTS

Figure 1:
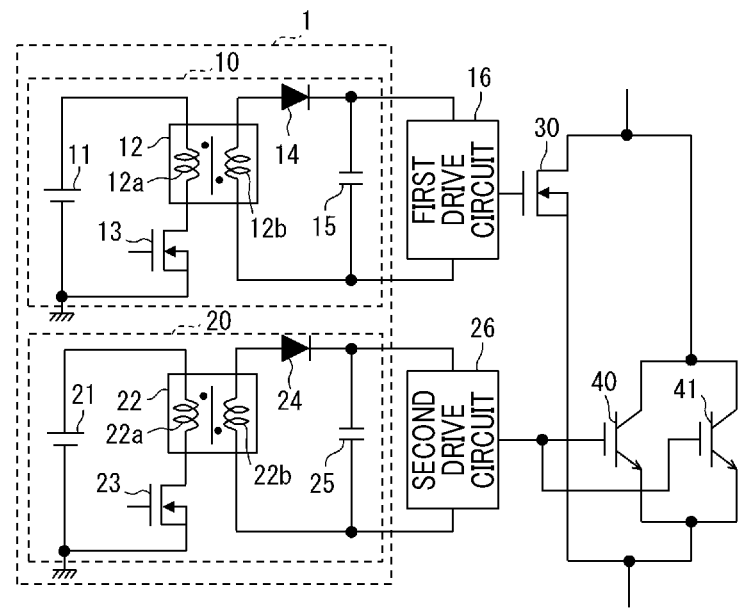
FIG. 1 is a diagram illustrating a configuration of a power device driving apparatus for driving a plurality of power devices connected in parallel according to a first embodiment.

In the related art, for example, when the plurality of switching elements being power devices connected in parallel are made of different materials or are of different types, an appropriate voltage (drive voltage) for driving the respective switching elements may be different between the switching elements. When the switching elements having different appropriate drive voltages are driven by using drive signals of the same voltage as known in the prior art, the voltage of the drive signal needs to be adjusted for the switching element that requires higher drive voltage, among the plurality of switching elements. This leads to a problem of wasteful consumption of power in the switching element for which lower drive voltage is sufficient, among the plurality of switching elements.

It is thus desired to provide a power device driving apparatus capable of driving a plurality of power devices whose appropriate drive voltages are different from one another while reducing an increase in power consumption.

An exemplary embodiment of the present disclosure provides a power device driving apparatus for driving a plurality of power devices that are connected in parallel to one another. The plurality of power devices includes a first power device and a second power device having different appropriate voltages for driving the plurality of power devices.

The power device driving apparatus comprises: (i) a plurality of drive circuits that are separately provided for at least the first power device and the second power device of the plurality of power devices, and that output drive signals to the respective power devices; and (ii) an isolated power supply that supplies a supply voltage to enable the plurality of drive circuits to output the drive signals. The isolated power supply includes a first isolated power supply unit that supplies a first supply voltage, and a second isolated power supply unit that supplies a second supply voltage that is different from the first supply voltage.

The plurality of drive circuits includes: (a) a first drive circuit that uses the first supply voltage supplied from the first isolated power supply unit to output the drive signal to the first power device by; and (b) a second drive circuit that uses the second supply voltage supplied from the second isolated power supply unit to output the drive signal to the second power device.

According to the exemplary embodiment, the power device driving apparatus includes the isolated power supply that includes the first isolated power supply unit and the second isolated power supply unit that generate different supply voltages. Further, the plurality of drive circuits includes the first drive circuit and the second drive circuit. The first drive circuit uses the first supply voltage supplied from the first isolated power supply unit to output the drive signal to the first power device. The second drive circuit uses the second supply voltage supplied from the second isolated power supply unit to output the drive signal to the second power device.

Thus, the first power device can be driven by the drive signal of the appropriate voltage outputted by the first drive circuit using the first supply voltage supplied from the first isolated power supply unit. The second power device can be driven by the drive signal of the appropriate voltage outputted by the second drive circuit using the second supply voltage supplied from the second isolated power supply unit.

First Embodiment

With reference to the drawings, a power device driving apparatus according to a first embodiment of the present disclosure will now be described. FIG. 1 is a diagram illustrating a configuration of a power device driving apparatus for driving a plurality of power devices connected in parallel according to a first embodiment. The plurality of power devices includes a first power device 30, and second power devices 40 and 41. The second power devices 40 and 41 are connected in parallel to allow a large current flow. The second power device may also be provided as a single power device.

For example, the plurality of power devices 30, 40, and 41 are used as switching elements of an inverter circuit for driving a three-phase motor. Further, according to the magnitude of a drive current of the three-phase motor, the power device driving apparatus may change the number of power devices to be driven. For example, the power device driving apparatus drives only the first power device 30 when the drive current of the three-phase motor is small, and drives the first and second power devices 30, 40, and 41 when the drive current is large.

Alternatively, as described later, when the first power device 30 is a silicon carbide (SiC) metal-oxide-semiconductor field-effect transistor (MOSFET) and the second power devices 40 and 41 are insulated-gate bipolar transistors (IGBTs), the power device driving apparatus first turns on the second power devices 40 and 41 and subsequently turns off the first power device 30 to thereby turn off the first and second power devices 30, 40, and 41. Thus, the loss due to a tail current of the IGBT can be reduced.

For example, the first power device 30 may include an SiC MOSFET, and the second power devices 40 and 41 may include IGBTs.

In such a case where materials and types of the power devices are different, an appropriate voltage for the drive signal may be different between the respective power devices. Specifically, as described above, when the first power element 30 includes an SiC MOSFET, the voltage of the drive signal is preferably of the order of 20 V. Further, when the second power devices 40 and 41 include IGBTs, the voltage of the drive signal is preferably of the order of 15 V.

According to the power device driving apparatus of the present embodiment, the first power device 30 and the second power devices 40 and 41 can be driven by drive signals of different voltages. In the following description, a configuration of the power device driving apparatus which generates drive signals of different voltages will be described.

As shown in FIG. 1, the power device driving apparatus of the present embodiment includes an isolated power supply 1. The isolated power supply 1 includes a first isolated power supply unit 10 and a second isolated power supply unit 20. In the first isolated power supply unit 10 and the second isolated power supply unit 20, an input circuit and an output circuit are isolated by a transformer.

The input circuit of the first isolated power supply unit 10 includes a power supply 11, a primary winding 12a of a first transformer 12, and a first switching element 13. Further, the output circuit of the first isolated power supply unit 10 includes a secondary winding 12b of the first transformer 12, a first diode 14, and a first capacitor 15. The primary winding 12a and the secondary winding 12b of the first transformer 12 have opposite polarities.

When the first switching element 13 is turned on and off by a control unit (not shown) performing a duty control, energy is stored in the first transformer 12 while the first switching element 13 is on. Then, when the first switching element 13 is turned off, the stored energy is released as an electric current from the secondary winding 12b, and is then subjected to half-wave rectification by the first diode 14 to be converted into direct current. The first capacitor 15 is charged by this direct current. The first capacitor 15 supplies the charged voltage to a first drive circuit 16 as a first supply voltage.

The control unit detects the first supply voltage supplied from the first capacitor 15 to the first drive circuit 16, and performs duty control (on-off control) for the first switching element 13 while varying the duty cycle (duty ratio) such that the detected first supply voltage becomes a target voltage (for example, 20 V) corresponding to an appropriate voltage of the drive signal for the first power device 30. Thus, the first isolated power supply unit 10 can supply the first drive circuit 16 with an appropriate voltage for driving the first power device 30.

The second isolated power supply unit 20 has the same configuration as the first isolated power supply unit 10. That is, the input circuit of the second isolated power supply unit 20 includes a power supply 21, a primary winding 22a of a second transformer 22, and a second switching element 23. Further, the output circuit of the second isolated power supply unit 20 includes a secondary winding 22b of the second transformer 22, a second diode 24, and a second capacitor 25. The primary winding 22a and the secondary winding 22b of the second transformer 22 have opposite polarities. When the second switching element 23 is turned on and off by a control unit (not shown), the second capacitor 25 is charged with a direct current, and the charged voltage is supplied to the second drive circuit 26 as a second supply voltage.

As described above, an appropriate voltage of the drive signal for the second power devices 40 and 41 is different from an appropriate voltage of the drive signal for the first power device 30. Therefore, the control unit performs duty control for the second switching element 23 while varying the duty cycle such that the second supply voltage becomes a target voltage (for example, 15 V) corresponding to an appropriate voltage of the drive signal for the second power devices 40 and 41. Thus, the duty cycle for turning on and off the first switching element 13 and the duty cycle for turning on and off the second switching element 23 are different from each other.

The above description is based on the assumption that the power supply 11 and the power supply 21 generate the same supply voltage, and the first transformer 12 and the second transformer 22 have the same turn ratio. However, in addition to or instead of varying the duty cycle, the turn ratio may be different between the first transformer 12 and the second transformer 22, or the supply voltage generated by the power supply 11 and the supply voltage generated by the power supply 21 may be different from each other to thereby allow the first supply voltage supplied from the first isolated power supply unit 10 and the second supply voltage supplied from the second isolated power supply unit 20 to be different from each other.

The first drive circuit 16 has a configuration which is typical as a drive circuit for the power device. Specifically, the first drive circuit 16 includes a high-side switch and a low-side switch connected in series, and the middle point thereof is connected to a gate of the first power device 30. Thus, when the high-side switch is turned on by a control unit (not shown), a drive signal having the first supply voltage supplied from the first isolated power supply unit 10 is applied to the gate of the first power device 30 to thereby turn on the first power device 30.

On the other hand, in order to turn off the first power device 30, the high-side switch of the first drive circuit 16 is turned off and the low-side switch is turned on by the control unit (not shown). Thus, the charge accumulated in the gate of the first power device 30 is discharged via the low-side switch to thereby turn off the first power device 30.

The second drive circuit 26, as with the first drive circuit 16, includes a high-side switch and a low-side switch connected in series, and the middle point thereof is connected to gates of the second power devices 40 and 41. Thus, when the high-side switch is turned on by a control unit (not shown), a drive signal having the second supply voltage supplied from the second isolated power supply unit 20 is applied to the gates of the second power devices 40 and 41 to thereby turn on the second power devices 40 and 41.

On the other hand, in order to turn off the second power devices 40 and 41, the high-side switch of the second drive circuit 26 is turned off and the low-side switch is turned on by the control unit (not shown). Thus, the charge accumulated in the gates of the second power devices 40 and 41 are discharged via the low-side switch to thereby turn off the second power devices 40 and 41.

As described above, the power device driving apparatus according to the present embodiment includes the isolated power supply 1 including the first isolated power supply unit 10 and the second isolated power supply unit 20 that generate different supply voltages.

Further, the power device driving apparatus according to the present embodiment includes, as the drive circuits for driving the power devices, the first drive circuit 16 configured to output a drive signal to the first power device 30 by using the first supply voltage supplied from the first isolated power supply unit 10 and the second drive circuit 26 configured to output a drive signal to the second power devices 40 and 41 by using the second supply voltage supplied from the second isolated power supply unit.

Thus, when the first drive circuit 16 and the second drive circuit 26 output a drive signal generated by using the first supply voltage supplied from the first isolated power supply unit 10 and the second supply voltage supplied from the second isolated power supply unit 20, respectively, the first power device 30 and the second power devices 40 and 41 can be driven by a drive signal of an appropriate voltage.

Second Embodiment

Figure 2:
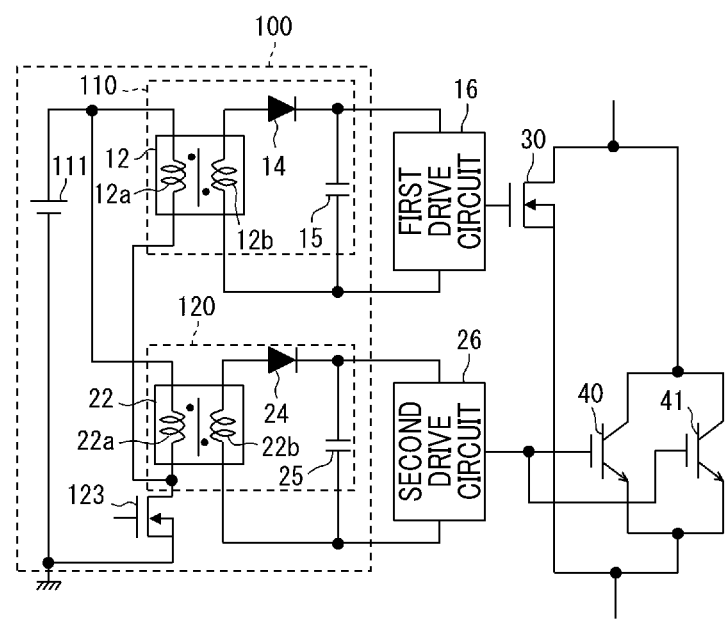
FIG. 2 is a diagram illustrating a configuration of a power device driving apparatus for driving a plurality of power devices connected in parallel according to a second embodiment.

With reference to the drawings, a power device driving apparatus according to a second embodiment of the present disclosure will now be described. FIG. 2 is a diagram illustrating a configuration of a power device driving apparatus according to the second embodiment. The same or similar components as those of the power device driving apparatus of the first embodiment are denoted by the same reference numerals, and description thereof may be omitted.

In the power device driving apparatus of the first embodiment described above, the first isolated power supply unit 10 and the second isolated power supply unit 20 each have the first switching element 13 and the second switching element 23. Further, drive duty cycles for the first switching element 13 and the second switching element 23 are individually controlled in a variable manner by the control unit (not shown) such that the first supply voltage supplied from the first isolated power supply unit 10 and the second supply voltage supplied from the second isolated power supply unit 20 correspond to the respective target voltages.

On the other hand, as shown in FIG. 2, in the power device driving apparatus of the second embodiment, an isolated power supply 100 is configured such that the primary winding 12a of the first transformer 12 and the primary winding 22a of the second transformer 22 are connected to a common power supply 111 and a common switching element 123. In other words, in the isolated power supply 100 of the power device driving apparatus of the present embodiment, the primary winding 12a of the first transformer 12 and the primary winding 22a of the second transformer 22 are connected in parallel. Further, the common power supply 111 and the common switching element 123 are connected in series with parallel circuits of the primary windings 12a and 22a.

Thus, in the power device driving apparatus of the present embodiment, since the components (the power supply 111 and the switching element 123) in an input circuit (primary circuit) of the isolated power supply 100 are shared, the number of components of the isolated power supply 100 can be reduced compared with the isolated power supply 1 of the first embodiment. Accordingly, a simplified configuration can be obtained.

As shown in FIG. 2, in the present embodiment, a first isolated power supply unit 110 includes the first transformer 12, the first diode 14, and the first capacitor 15, and a second isolated power supply unit 120 includes the second transformer 22, the second diode 24, and the second capacitor 25.

Furthermore, in the present embodiment, since the switching element 123 is shared, the energization time to the primary windings 12a and 22a of the first transformer 12 in the first isolated power supply unit 110 and the second transformer 22 in the second isolated power supply unit 120, respectively, cannot be different from each other. Therefore, in the power device driving apparatus of the present embodiment, the first transformer 12 and the second transformer 22 have different turn ratios according to the respective target voltages to thereby allow the first supply voltage supplied from the first isolated power supply unit 110 and the second supply voltage supplied from the second isolated power supply unit 120 to be different from each other.

Further, a control unit (not shown) detects one of the first supply voltage and the second supply voltage, and controls the drive duty cycle for the switching element 123 such that the detected supply voltage becomes the target voltage. As a result, due to a difference between the turn ratios of the first transformer 12 and the second transformer 22, the other of the supply voltages, which is the supply voltage that is not detected, is also brought to the target voltage.

Third Embodiment

Figure 3:
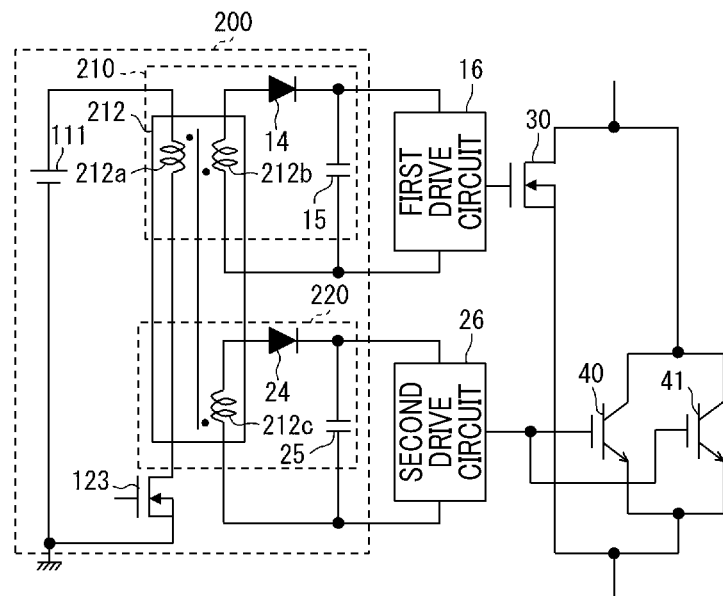
FIG. 3 is a diagram illustrating a configuration of a power device driving apparatus for driving a plurality of power devices connected in parallel according to a third embodiment.

With reference to the drawings, a power device driving apparatus according to a third embodiment of the present disclosure will now be described. FIG. 3 is a diagram illustrating a configuration of a power device driving apparatus according to the third embodiment. The same or similar components as those of the power device driving apparatus of the first embodiment and the second embodiment are denoted by the same reference numerals, and description thereof may be omitted.

In the power device driving apparatus of the second embodiment described above, the number of components in the isolated power supply 100 is reduced by sharing the power supply 111 and the switching element 123 of the input circuit (primary circuit) of the isolated power supply 100. On the other hand, according to a power device driving apparatus of the present embodiment, the number of components can be further reduced by further sharing the primary winding of the transformer.

As shown in FIG. 3, an isolated power supply 200 of the power device driving apparatus of the present embodiment includes only one transformer 212. The transformer 212 includes a common primary winding 212a that is shared by a first isolated power supply unit 210 and a second isolated power supply unit 220. A secondary winding 212b of the first isolated power supply unit 210 and a secondary winding 212c of the second isolated power supply unit 220 are both magnetically coupled to the common primary winding 212a.

Further, the secondary winding 212b of the first isolated power supply unit 210 and the secondary winding 212c of the second isolated power supply unit 220 have the number of turns corresponding to the respective target supply voltages of the first and second isolated power supply units 210 and 220. Thus, the number of turns of the secondary winding 212b of the first isolated power supply unit 210 and the number of turns of the secondary winding 212c of the second isolated power supply unit 220 are different from each other.

In addition, in the present embodiment as well, a control unit (not shown) detects one of the first supply voltage and the second supply voltage, and controls the drive duty cycle for the switching element 123 such that the detected supply voltage becomes the target voltage. Thus, the first and second isolated power supply units 210 and 220 can supply respective target supply voltages.

Fourth Embodiment

Figure 4:
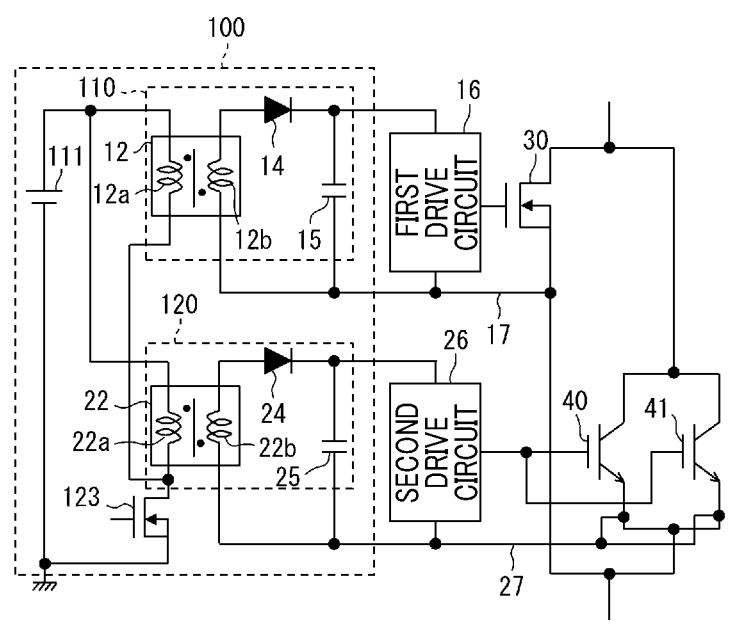
FIG. 4 is a diagram illustrating a configuration of a power device driving apparatus for driving a plurality of power devices connected in parallel according to a fourth embodiment.

With reference to the drawings, a power device driving apparatus according to a fourth embodiment of the present disclosure will now be described. FIG. 4 is a diagram illustrating a configuration of a power device driving apparatus according to the fourth embodiment. The same or similar components as those of the power device driving apparatus of the first embodiment to the third embodiment are denoted by the same reference numerals, and description thereof may be omitted.

As shown in FIG. 4, a power device driving apparatus of the present embodiment includes a first connection line 17 that connects a low potential side of the first isolated power supply unit 110 to an emitter (source) side of the first power device 30 driven by the first drive circuit 16 which uses the first supply voltage, and a second connection line 27 that connects a low potential side of the second isolated power supply unit 120 to an emitter (source) side of the second power devices 40 and 41 driven by the second drive circuit 26 which uses the second supply voltage.

These first and second connection lines 17 and 27 are provided such that the first isolated power supply unit 110 and the second isolated power supply unit 120 can output a first supply voltage and a second supply voltage on the basis of the emitter (source) potential of the power devices 30, 40, and 41. Thus, the respective supply voltages are less susceptible to potential variation due to switching of other power devices or the like, and ensure the corresponding power devices are stably turned on.

Furthermore, although FIG. 4 shows an example in which the first and second connection lines 17 and 27 are provided in the isolated power supply 100 of the second embodiment, the first and second connection lines 17 and 27 may also be provided in the isolated power supply 1 of the first embodiment or the isolated power supply 200 of the third embodiment.

Although the preferred embodiments of the present disclosure have been described above, the present disclosure is not limited in any way by the aforementioned embodiments. Various modifications can be made to the embodiments without departing from the scope of the present disclosure.

For example, in the first to fourth embodiments described above, two types of power devices, which are the first power device 30 and the second power devices 40 and 41, are connected in parallel. However, three or more types of power devices can also be connected in parallel. In this case, the isolated power supply may include isolated power supply units that generate three or more different supply voltages corresponding to the three or more types of power devices, and the plurality of drive circuits may be three or more drive circuits for outputting drive signals using these different supply voltages.

What is claimed is:

1. A power device driving apparatus for driving a plurality of power devices that are connected in parallel to one another, the plurality of power devices including a first power device and a second power device having different voltages for driving the plurality of power devices, the power device driving apparatus comprising:
a plurality of drive circuits that are separately provided for at least the first power device and the second power device of the plurality of drive circuits, and that output drive signals to the respective power devices; and
an isolated power supply that supplies a supply voltage to enable the plurality of drive circuits to output the drive signals, the isolated power supply including
a first isolated power supply unit that supplies a first supply voltage, and
a second isolated power supply unit that supplies a second supply voltage which is different from the first supply voltage,
the plurality of drive circuits including
a first drive circuit that uses the first supply voltage supplied from the first isolated power supply unit to output the drive signal to the first power device, and
a second drive circuit that uses the second supply voltage supplied from the second isolated power supply unit to output the drive signal to the second power device, wherein
the isolated power supply comprises
a common primary winding that is shared by the first isolated power supply unit and the second isolated power supply unit, and
a switching element that is connected to the common primary winding;
the first isolated power supply unit comprises a secondary winding that is magnetically coupled to the common primary winding;
the second isolated power supply unit comprises a secondary winding that is magnetically coupled to the common primary winding; and
a turn ratio of the secondary winding of the first isolated power supply unit and a turn ratio of the secondary winding of the second isolated power supply unit are set to differ from each other.

2. The power device driving apparatus according to claim 1, wherein:
the switching element is driven by a duty control signal that controls a duty cycle for driving the switching element such that a detected supply voltage becomes a target voltage, the detected supply voltage being one of the first supply voltage supplied from the first isolated power supply unit and the second supply voltage supplied from the second isolated power supply unit.

3. The power device driving apparatus according to claim 1, further comprising:
a first connection line that connects a low potential side of the first isolated power supply unit and an emitter side of the first power device that is driven by the first drive circuit using the first supply voltage; and
a second connection line that connects a low potential side of the second isolated power supply unit and an emitter side of the second power device that is driven by the second drive circuit using the second supply voltage.

* * * * *